United States Patent
Tseng et al.

(10) Patent No.: US 11,393,857 B2
(45) Date of Patent: *Jul. 19, 2022

(54) IMAGE SENSOR AND IMAGE SENSING-ENABLED DISPLAY APPARATUS INCLUDING THE SAME, AND METHOD OF MAKING THE IMAGE SENSOR

(71) Applicant: SHANGHAI HARVEST INTELLIGENCE TECHNOLOGY CO., LTD., Shanghai (CN)

(72) Inventors: Hong-Yih Tseng, Tainan (CN); Jiandong Huang, Shanghai (CN)

(73) Assignee: SHANGHAI HARVEST INTELLIGENCE TECHNOLOGY CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/491,558

(22) PCT Filed: Jun. 11, 2018

(86) PCT No.: PCT/CN2018/090546
§ 371 (c)(1),
(2) Date: Sep. 5, 2019

(87) PCT Pub. No.: WO2018/228297
PCT Pub. Date: Dec. 20, 2018

(65) Prior Publication Data
US 2020/0227448 A1    Jul. 16, 2020

(30) Foreign Application Priority Data

Jun. 12, 2017 (CN) .......................... 201710438624.5

(51) Int. Cl.
*H01L 27/146* (2006.01)
*H01L 27/32* (2006.01)
(Continued)

(52) U.S. Cl.
CPC .... *H01L 27/1461* (2013.01); *H01L 27/14616* (2013.01); *H01L 27/14625* (2013.01);
(Continued)

(58) Field of Classification Search
CPC ........... H01L 27/1461; H01L 27/14616; H01L 27/14625; H01L 27/14685;
(Continued)

(56) References Cited

U.S. PATENT DOCUMENTS 5,035,753 A * 7/1991 Suzuki .................. H01L 31/206
136/249
5,079,426 A * 1/1992 Antonuk ................ A61B 6/032
250/370.06

(Continued)

FOREIGN PATENT DOCUMENTS

KR    20080086688 A * 9/2008
KR    20080086688 A * 9/2008
(Continued)

*Primary Examiner* — Bitew A Dinke
(74) *Attorney, Agent, or Firm* — Womble Bond Dickinson (US) LLP

(57) ABSTRACT

An image sensor (32) includes a plurality of pixel sensing portion (320) that are arranged in columns and rows. Each of the pixel sensing portions (320) includes a thin film transistor (11), and a photodetection diode (13) including n-type (16), intrinsic (15), and p-type semiconductor layers (14). The intrinsic semiconductor layer (15) of the photodetection diode (13) of each of the pixel sensing portions (320) has a crystallinity gradient that varies from an amorphous silicon structure to a microcrystalline silicon structure along a first direction (L1) extending from the p-type semiconductor layer (14) toward the n-type semiconductor layer (16). An image sensing-enabled display apparatus (3) and a method of making the image sensor (32) are also disclosed.

11 Claims, 12 Drawing Sheets

(51) Int. Cl.

| | |
|---|---|
| H01L 29/786 | (2006.01) |
| H01L 31/0232 | (2014.01) |
| H01L 31/0392 | (2006.01) |
| H01L 31/105 | (2006.01) |
| H01L 31/18 | (2006.01) |
| H01L 51/00 | (2006.01) |

(52) U.S. Cl.
CPC .. H01L 27/14685 (2013.01); H01L 27/14692 (2013.01); *H01L 27/3234* (2013.01); *H01L 27/3244* (2013.01); *H01L 29/78669* (2013.01); *H01L 31/02327* (2013.01); *H01L 31/03926* (2013.01); *H01L 31/1055* (2013.01); *H01L 31/1892* (2013.01); *H01L 51/0097* (2013.01); *H01L 2227/326* (2013.01); *H01L 2251/5338* (2013.01)

(58) Field of Classification Search
CPC ........... H01L 27/14692; H01L 27/3234; H01L 27/3244; H01L 29/78669; H01L 31/02327; H01L 31/03926; H01L 31/1055; H01L 31/1892; H01L 51/0097; H01L 2227/326; H01L 2251/5338; H01L 31/105; H01L 27/14658; H01L 27/146; H01L 27/14605; H01L 27/14643; H01L 27/14683

See application file for complete search history.

(56) References Cited

U.S. PATENT DOCUMENTS

| | | | | |
|---|---|---|---|---|
| 5,276,329 A * | 1/1994 | Hughes | ................ | G01T 1/2018 250/370.09 |
| 6,180,444 B1 * | 1/2001 | Gates | ................ | H01L 27/0814 257/E21.358 |
| 9,269,737 B1 * | 2/2016 | O'Rourke | ........ | H01L 27/14643 |
| 9,571,766 B2 * | 2/2017 | Fujita | .................... | H04N 5/369 |
| 2007/0164333 A1 * | 7/2007 | Wright | .................... | H01L 27/12 257/292 |
| 2007/0210257 A1 * | 9/2007 | Masuda | ................... | H04N 5/32 250/370.09 |
| 2008/0111779 A1 * | 5/2008 | Matsumoto | ........... | H01L 27/124 345/87 |
| 2008/0245968 A1 * | 10/2008 | Tredwell | ........... | H01L 27/14632 250/370.09 |
| 2009/0026509 A1 * | 1/2009 | Hayashi | ........... | H01L 27/14612 257/292 |
| 2011/0109592 A1 * | 5/2011 | Kurokawa | ........... | G06F 3/0416 345/175 |
| 2011/0266599 A1 * | 11/2011 | Ishida | ............... | H01L 27/14658 257/292 |
| 2012/0061578 A1 * | 3/2012 | Lim | .................. | H01L 27/14663 250/370.14 |
| 2012/0153173 A1 * | 6/2012 | Chang | ............... | H01L 27/14658 250/370.08 |
| 2013/0037815 A1 * | 2/2013 | Okajima | ........... | H01L 27/14678 257/59 |
| 2013/0105806 A1 * | 5/2013 | Liu | ........................ | H01L 29/04 257/64 |
| 2013/0308030 A1 * | 11/2013 | Fujita | ..................... | H04N 5/347 348/302 |
| 2014/0027828 A1 * | 1/2014 | Kim | .................. | H01L 27/14632 257/292 |
| 2014/0231804 A1 * | 8/2014 | Yan | ................... | H01L 27/14616 257/53 |
| 2015/0340511 A1 * | 11/2015 | Yan | ................... | H01L 29/66969 257/43 |
| 2016/0127668 A1 * | 5/2016 | Fujita | ................ | H01L 27/14661 348/308 |
| 2016/0322416 A1 * | 11/2016 | Nara | .................... | H01L 29/7869 |
| 2016/0365381 A1 * | 12/2016 | Zhao | ................ | H01L 27/14692 |
| 2017/0365224 A1 * | 12/2017 | Okamoto | ............. | G09G 3/3426 |
| 2020/0229709 A1 * | 7/2020 | Huang | ................ | A61B 5/4872 |
| 2020/0295077 A1 * | 9/2020 | Huang | ................ | H01L 31/202 |
| 2020/0321384 A1 * | 10/2020 | Huang | ................ | H01L 27/3234 |
| 2020/0327305 A1 * | 10/2020 | Huang | .................... | H04W 4/90 |
| 2020/0388646 A1 * | 12/2020 | Tseng | ................ | H01L 31/186 |
| 2020/0388719 A1 * | 12/2020 | Huang | ................ | H01L 31/113 |
| 2020/0395498 A1 * | 12/2020 | Huang | ............... | H01L 31/1804 |

FOREIGN PATENT DOCUMENTS

| | | | |
|---|---|---|---|
| KR | 20160054102 A | * | 5/2016 |
| KR | 101644056 B1 | * | 8/2016 |
| KR | 101644056 B1 | * | 8/2016 |

* cited by examiner

IMAGE SENSOR AND IMAGE SENSING-ENABLED DISPLAY APPARATUS INCLUDING THE SAME, AND METHOD OF MAKING THE IMAGE SENSOR

FIELD

The disclosure relates to an image sensor, and more particularly to an image sensor including an intrinsic semiconductor layer having a crystallinity gradient, an image sensing-enabled display apparatus including the image sensor, and a method of making the image sensor.

BACKGROUND

Mobile apparatuses, such as smart phone, smart tablet computer, and laptop computer, have become a daily necessity for most people nowadays. The mobile apparatuses generally have a display member in common. With the development of display technology toward a flexible display member, the flexible display member has been used in a foldable mobile apparatus or a rollable mobile apparatus so as to provide new appearance and additional function different from those of conventional rigid mobile apparatuses. For example, a foldable smart phone can be unfolded to become a smart tablet computer, and can serve as a laptop computer when it is used with an external keyboard. With the inclusion of the flexible display member, multiple mobile apparatuses having different functions can be integrated in a single apparatus which possesses thin, light and portable properties. For example, a flexible display overcenter assembly and a flexible display flexure assembly are disclosed in U.S. Pat. Nos. 8,804,324 B2 and 9,176,535 B2, respectively.

A conventional display member, such as a liquid crystal display (LCD) member or an active matrix organic light emitting display (AMOLED) member, includes a plurality of thin-film transistors (TFTs) and a plurality of pixels that are arranged in an array. Each of the pixels is driven by a respective one of the thin-film transistors for displaying an image. Each of the TFTs is a field-effect transistor that includes a semiconductor layer made from a semiconducting material such as amorphous silicon, crystalline silicon, indium gallium zinc oxide (IGZO), a nanocarbon material-mixed organic material, and combinations thereof. The TFTs may be formed on a flexible substrate, such as a heat resistant polymeric substrate including polyimide.

Since photodetection diodes may be manufactured using the above semiconducting material and since production equipment of the photodetection diodes is incorporable into production equipment of the TFTs array, an image sensor including a plurality of photodetection diodes and a plurality of TFTs arranged in an array is manufactured using the production equipment of the TFTs array and is utilized in different fields, such as an X-ray flat panel detector disclosed in Chinese Invention Patent Publication No. CN 103829959 B, and an X-ray image sensing element and a sensing module disclosed in Chinese Invention Patent Publication No. CN 102903721 B. Compared with image sensors made from conventional crystalline materials, the semiconducting material for making the photodetection diodes of the conventional image sensor has a band gap for absorbing substantial visible light, and the conventional image sensor has a relatively low signal-to-noise ratio (SNR) due to less interference from environmental visible light. Hence, the application of the image sensor focuses primarily on the technical aspects of X-ray sensing, such as the abovementioned X-ray flat panel detector and X-ray image sensing element and sensing module. For alleviating the interference from the environmental visible light, the abovementioned X-ray flat panel detector and the X-ray image sensing element and sensing module include at least one fluorescent layer or flickering layer for converting an incident X-ray light, which has a relatively short wavelength and a relatively high collimation, to the visible light. The visible light subsequently emits on the photodetection diodes.

When the image sensor is incorporated with the flexible substrate and then is integrated with the display member to be disposed in a flexible display device, the integration of the image sensor with the display member can be contemplated so as to realize the flexible display device with a photodetection function, i.e., a flexible image-sensing display device. However, since the conventional display member is limited by its thickness and a pixel aperture ratio thereof, an image generated from the light detected by the photodiodes is distorted because of optical diffraction. Besides, since incident light has to pass through multiple layers of the conventional display member before being detected by the photodetection diodes, and since there are optical display signals and touch sensing signals being transmitted in the flexible image sensing display device, it is difficult to retrieve useful optical signals from the environment inside the flexible image sensing display device with a low signal-to-noise ratio. The difficulty level in retrieving the useful optical signals is approximately equal to that of single-photon imaging. An original image generated by the electrical signals has to be resolved by reconstruction through an algorithm on the basis of an optical theory. In order to deal with the difficulty of optical-signal retrieval, it is proposed to further dispose an optical reinforcing member in the conventional flexible image-sensing display device or to dispose the image sensor on one side of the display member, such as a display module disclosed in Chinese Invention Patent Publication No. 101359369 B, so as to reconstruct the image through light that is not vertically incident on the side of the display member. However, inclusion of the optical reinforcing member disadvantageously increases the thickness of the flexible image-sensing display device, and side-arrangement of the photodiodes on the display member tends to obstruct full-screen viewing. When the flexible image-sensing display device is applied to the foldable mobile apparatus, it is difficult to integrate multiple functions in the foldable mobile apparatus including the flexible image-sensing display device.

Referring to FIG. 1, a conventional image sensor includes a photodetection diode that includes an amorphous silicon n-type layer 93, an amorphous silicon intrinsic layer 92 formed on the amorphous silicon n-type layer 93, and an amorphous silicon p-type layer formed on the amorphous silicon intrinsic layer 92. The image sensor has a relatively low photoelectric conversion efficiency and the amorphous silicon intrinsic layer 92 thereof has a relatively serious staebler-Wronski effect occurred at the initial stage of light exposure. Thus, the conventional image sensor does not satisfy the high light sensitivity required by a conventional thin film apparatus, such as a flexible display apparatus, and cannot be easily applied to a flexible display apparatus with photodetection function. Besides, the additional difficulty in integration of the flexible image sensor with the flexible display apparatus comes from maintenance, reliability and the lifetime of the flexible display apparatus, which depends on water resistance and oxygen barrier properties of the flexible display apparatus. For example, an flexible AMOLED is required to have a water vapor transmission rate of at least less than $10^{-6}$ g/m² per day, and an oxygen transmission rate of at least less than $10^{-6}$ cm³/m²·bar per day. Hence, it is also a focal point to develop the flexible image-sensing display apparatus with satisfactory water resistance and oxygen resistance.

Therefore, there is plenty of room for improving the image sensor included in the image-sensing display apparatus and for improving a method of making the image sensor so as to expand the wavelength range received by the image sensor and to increase the photoelectric conversion efficiency of the image sensor.

SUMMARY

Therefore, an object of the disclosure is to provide an image sensor that can alleviate at least one of the drawbacks of the prior art.

According one aspect of the disclosure, an image sensor includes a plurality of pixel sensing portions that are arranged in m columns and n rows. Each of m and n is a positive integer not less than 1. Each of the pixel sensing portions includes: a thin film transistor, and a photodetection diode that is electrically connected to the thin film transistor and that includes an n-type semiconductor layer, an intrinsic semiconductor layer formed on the n-type semiconductor layer, and a p-type semiconductor layer formed on the intrinsic semiconductor layer.

The intrinsic semiconductor layer of the photodetection diode of each of the photodetection pixel portions has a crystallinity gradient that varies from an amorphous silicon structure to a microcrystalline silicon structure along a first direction (L1) extending from the p-type semiconductor layer toward the n-type semiconductor layer.

According another aspect of the disclosure, an image sensing-enabled display apparatus includes a display unit defining an image-sensing region, and at least one the above image sensor disposed below the image-sensing region.

According another aspect of the disclosure, a method of making an image sensor includes: forming a removable adhesive layer on a template; forming a substrate on the removable adhesive layer; forming a thin-film transistor on the substrate; forming a photodetection diode on the substrate by forming an n-type semiconductor layer on the substrate, forming an intrinsic semiconductor layer on the n-type semiconductor layer, and forming a p-type semiconductor layer on the intrinsic semiconductor layer that has a crystallinity gradient that varies from an amorphous silicon structure to a microcrystalline silicon structure alone a first direction extending from the p-type semiconductor layer toward the n-type semiconductor layer; and removing the removable adhesive layer and the template from the substrate.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
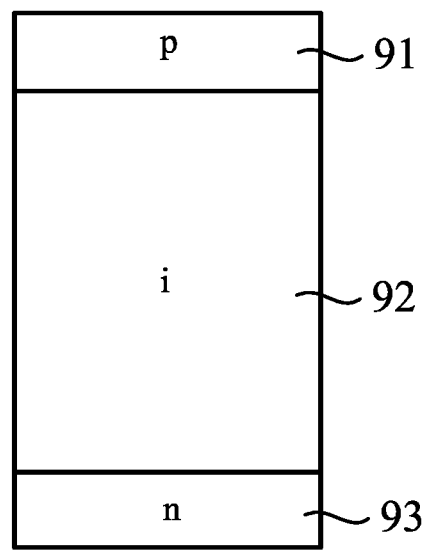
FIG. 1 is a schematic view illustrating a conventional photodetection diode of a conventional image sensor.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
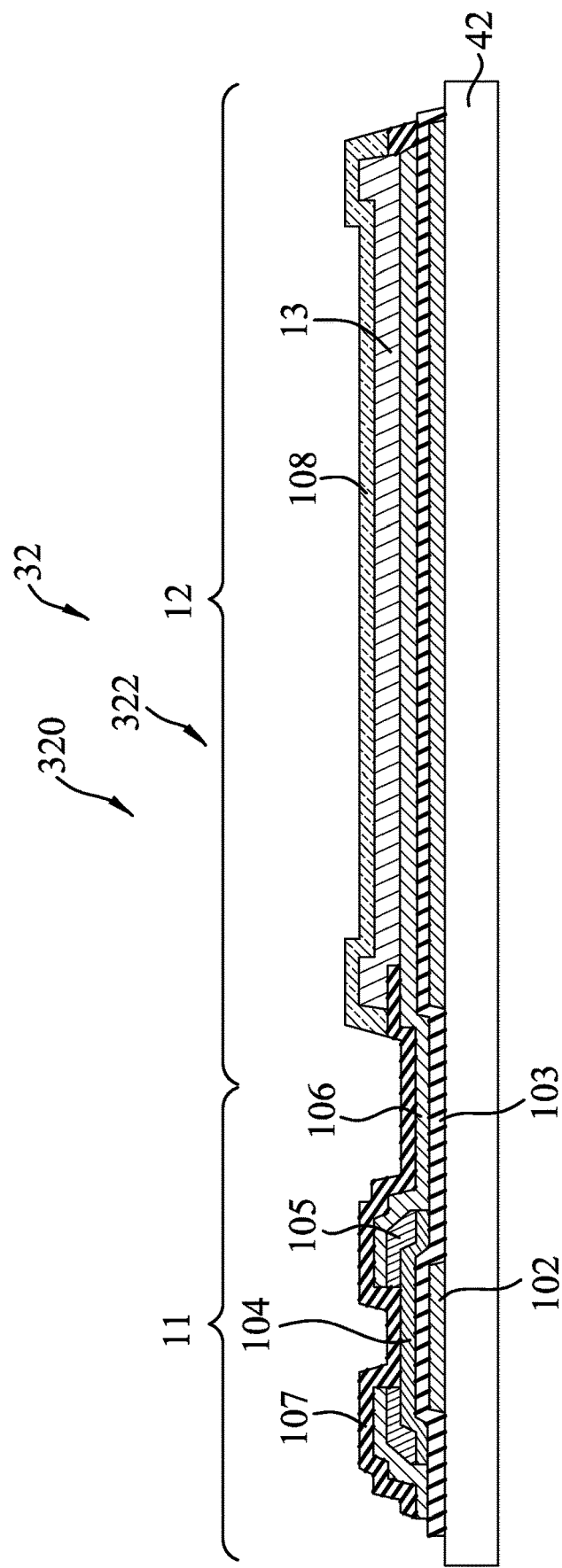
FIG. 2 is a schematic cross-sectional view illustrating one of pixel sensing portions of an embodiment of an image sensor according to the disclosure.
Figure 3:
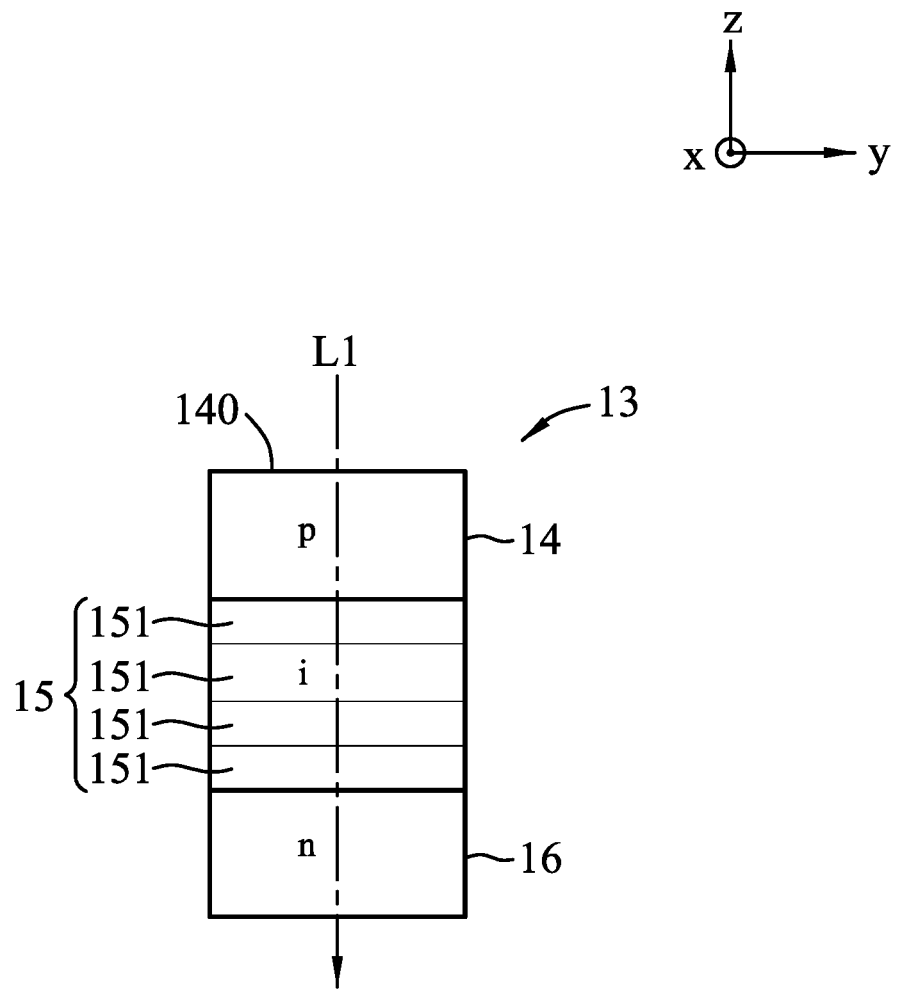
FIG. 3 is a schematic view illustrating a photodetection diode of the embodiment of the image sensor.

Referring to FIGS. 2 and 3, an embodiment of an image sensor 32 according to the disclosure is illustrated. The embodiment of the image sensor includes a substrate 42, a plurality of pixel sensing portions 320 (only one is shown in FIG. 2) that are formed on the substrate 42 and that are arranged in m columns and n rows. Each of m and n is a positive integer not less than 1. The substrate 42 may be a glass sheet or a flexible polymeric sheet. Each of the pixel sensing portions 320 includes a thin film transistor 11, and a photodetection region 322 that includes a photodetection diode 13 that is electrically connected to the thin film transistor 11 and that includes an n-type semiconductor layer 16, an intrinsic semiconductor layer 15 formed on the n-type semiconductor layer 16, and a p-type semiconductor layer 14 formed on the intrinsic semiconductor layer 15. The intrinsic semiconductor layer 15 has a crystallinity gradient that varies from an amorphous silicon structure to a microcrystalline silicon structure along a first direction (L1) extending from the p-type semiconductor layer 14 toward the n-type semiconductor layer 16.

The thin film transistor 11 of each of the pixel sensing portions 320 is used for transmitting an electrical signal from the photodetection diode 13. In the embodiment, the substrate 42 is a polymeric substrate that is disposed to the thin film transistor 11 and the photodetection diode 13 of each of the pixel sensing portions 320. The polymeric substrate 42 includes polyimide.

The thin film transistor 11 includes a gate electrode metal layer 102, a first electrically isolating layer 103, an intrinsic amorphous silicon channel layer 104, a n⁺-doping amorphous silicon source/drain contact layer 105, a source/drain electrode layer 106, and a second electrically isolating layer 107 sequentially formed on the polymeric substrate 42 in that order. The thin film transistor 11, the gate electrode metal layer 102, the first and second electrically isolating layers 103, 107, the intrinsic amorphous silicon channel layer 104, the $n^+$-doping amorphous silicon source/drain contact layer 105, and the source/drain electrode layer 106 are not of the essence of the present disclosure and therefore will not be further elaborated for the sake of brevity.

The photodetection region 322 of each of the pixel sensing portions 320 further includes a transparent metal-oxide electrode layer 108 formed on the photodetection diode 13 and a portion of layers of the photodetection region 322 are formed together with the layers of the thin film transistor 11, such as the gate electrode layer 102, the first electrically isolating layer 103, the source/drain electrode layer 106, the second isolating layer 107. In other words, when the gate electrode layer 102, the first isolating layer 103, the source/drain electrode layer 106 and the second isolating layer 107 of each of the pixel sensing portions 320 are formed, these layers extend from the thin film transistor 11 to the photodetection region 322.

Crystalline silicon normally has a tetrahedron structure where each of silicon atoms is tetrahedrally and covalently bonded to four neighboring silicon atoms. The tetrahedral structure of the crystalline silicon (c-Si) is able to continue over a large range, thus forming a well-ordered crystal lattice. However, for amorphous silicon, the long range of the tetrahedral structure as with the c-Si is not present and silicon atoms form a continuous random network. In other words, not all of the silicon atoms of the amorphous silicon are arranged as the tetrahedral structure. Hence, a portion of the silicon atoms of the amorphous silicon have dangling bonds due to such random structural arrangement, and cannot be covalently bonded to the neighboring silicon atoms. However, electrical conductivity of the amorphous silicon is reduced by the dangling bonds. In practical use, the dangling bonds may be passivated by hydrogen, and thus density of dangling bonds of the hydrogenated amorphous silicon can be reduced drastically so as to satisfy the requirement for a semiconducting material. However, since the number of the dangling bonds in the hydrogenated amorphous silicon is still much greater than that of the crystalline silicon, application of this hydrogenated amorphous silicon to a p-doping semiconductor structure or an n-doping semiconductor structure will result in more defects than application of crystalline silicon to the p-doping or n-doping semiconductor structures. Furthermore, when the hydrogenated amorphous silicon is applied to an intrinsic semiconductor structure of a photodetection diode, Staebler-Wronski effect occurs in the intrinsic semiconductor structure during the initial stage of light exposure.

In this embodiment, the intrinsic semiconductor layer 15 of the photodetection diode 13 of each of the pixel sensing portions 320 has a crystallinity gradient that varies from an amorphous silicon structure to a microcrystalline silicon structure along the first direction (L1). Hence, the photodetection wavelength range of the photodetection diode 13 of the embodiment can expand from the visible light region to the infrared light region or near the infrared light region, and thus the photoelectric conversion efficiency can be improved. More specifically, the intrinsic semiconductor layer 15 of the photodetection diode 13 of each of the pixel sensing portions 320 defines a plurality of intrinsic semiconductor sub-layers 151 extending along a second direction (L2) perpendicular to the first direction (L1). In this embodiment, four of the intrinsic semiconductor sub-layers 151 are shown. Each of the intrinsic semiconductor sub-layers 151 has a homogenous crystallinity. When the first direction (L1) extends in a Z-axis of a coordinate system, each of the intrinsic semiconductor sub-layers 151 that extends along the second direction (L2) extends over and is formed uniformly in the x-y plane of the coordinate system. For example, one of the intrinsic semiconductor sub-layers 151 which intersects the Z axis at a point z1 may uniformly has a crystallinity of 8%, and another one of the intrinsic semiconductor sub-layers 151 below the one of the intrinsic semiconductor sub-layers 151 relative to the n-type semiconductor layer 16 may uniformly has a crystallinity of 16% or 20%. In other words, the crystallinity of each of the intrinsic semiconductor sub-layers 151 is uniformly distributed in the x-y plane, and the intrinsic semiconductor layer 15 which defines the intrinsic semiconductor sub-layers 151 has a crystallinity gradient gradually increased in the first direction (L1) from 0% (corresponding to the amorphous silicon structure) to larger than 40% (corresponding to the crystalline silicon structure). Hence, the photoelectric conversion efficiency (e.g., photoelectric conversion quantum efficiency) of the photodetection diode 13 can be improved, and the image sensor 32 including the photodetection diode 13 can be used in a high photosensitivity field, e.g., an image sensing-enabled display apparatus having a relatively large sensing area.

Specifically, when there are more than four of the intrinsic semiconductor sub-layers 151 present in the intrinsic semiconductor layer 15, the crystallinities of the intrinsic semiconductor sub-layers 151 may vary by a fixed amount, such as 8%, along the first direction (L1), i.e., the crystallinities of the intrinsic semiconductor sub-layers 151 superimposed on one another in the first direction (L1) may respectively be 0, 8%, 16%, 24%, 32%, 40%, etc. In another form, the crystallinities of the intrinsic semiconductor sub-layers 151 may vary by a variable amount along the first direction (L1). For example, the crystallinities of the intrinsic semiconductor sub-layers 151 superimposed in the first direction (L1) may respectively be 0, 6%, 15%, 22%, 30%, 40%, etc. Hence, the crystallinity gradient of the intrinsic semiconductor layer 15 may be determined based on the actual use within the predetermined threshold range, i.e., 0% of the amorphous silicon structure to 40% of the crystalline silicon structure.

In this embodiment, the intrinsic semiconductor layer 15 of the photodetection diode 13 of each of the pixel sensing portions 320 may be made from silanes and hydrogen gas using the CVD techniques. Hydrogen gas ratio, deposition temperature, and deposition power are three process parameters for forming the intrinsic semiconductor layer 15. The hydrogen gas ratio, deposition temperature, and deposition power for forming the microcrystalline silicon structure are higher than that for forming the amorphous silicon structure. By means of gradually increasing the hydrogen gas ratio, the deposition temperature, and the deposition power during the CVD process along with the increase in the crystallinity, the resulting intrinsic semiconductor layer 15 has a band gap decreasing from 1.7 eV along the first direction (L1) and an average band gap less than 1.7 eV so as to have the required crystallinity gradient.

Figure 6:
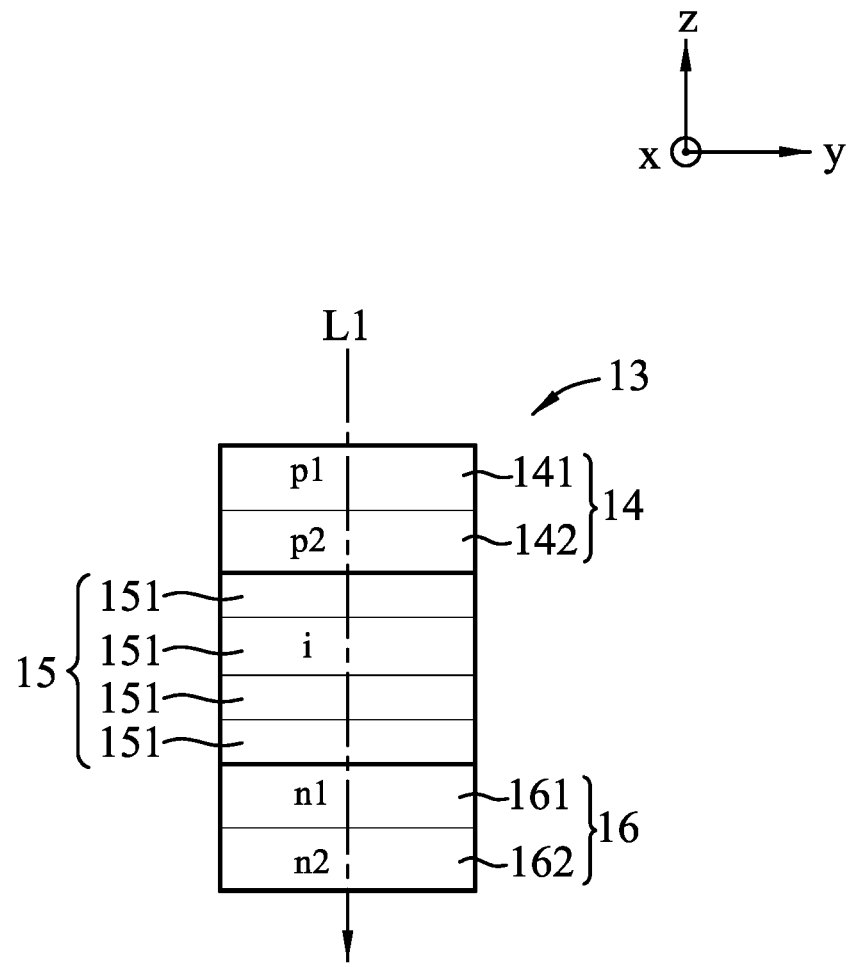
FIG. 6 is a schematic view illustrating another configuration of the photodetection diode of the embodiment of the image sensor.

Referring to FIGS. 3 and 6, the p-type semiconductor layer 14 of the photodetection diode 13 of each of the pixel sensing portions 320 may have a single-layered structure or a multi-layered structure, and may be made from silanes, hydrogen gas and trimethyl boron ($B(CH_3)_3$) using the CVD techniques or may be made from silanes, hydrogen gas and borane using the CVD techniques. More specifically, as shown in FIG. 6, the multi-layered structure of the p-type semiconductor layer 14 includes a lower p-type semiconductor layered portion 142 formed on the intrinsic semiconductor layer 15 and an upper p-type semiconductor layered portion 141 formed on the lower p-type semiconductor layered portion 142. The upper p-type semiconductor layered portion 141 has a band gap greater than 1.7 eV and a p-type dopant in an amount not less than two times of that of the lower p-type semiconductor layered portion 142, so that the p-type semiconductor layer 14 has a band gap greater than 1.7 eV. In the embodiment, the p-type dopant is boron and is provided from trimethyl boron ($B(CH_3)_3$) or borane. By virtue of the structure of the p-type semiconductor layer 14, when the incident light passes from a top surface of the p-type semiconductor layer 14 to the n-type semiconductor layer 16 through the intrinsic semiconductor layer 15, the incident light absorbed by the p-type semiconductor layer 14 can be reduced, and thus the light passing through the p-type semiconductor layer 14 and absorbed by the intrinsic semiconductor layer 15 can be increased. Hence, the photoelectric conversion efficiency of the image sensor 32 of the disclosure can be enhanced so as to satisfy the actual application requirements.

Specifically, in the multi-layered structure of the p-type semiconductor layer 14, the upper p-type semiconductor layered portion 141 of the p-type semiconductor layer 14 has a non-crystalline silicon structure and is heavily doped with the p-type dopant of borane, which leads to the increase in dangling bonds. If the p-type semiconductor layer 14 only includes the heavily doped upper p-type semiconductor layered portion 141, uniformity of built-in voltage of the photodetection diode 13 tends to be further damaged or destroyed. Inclusion of the lower p-type semiconductor layered portion 142 will alleviate the damage or destruction of the uniformity of built-in voltage of the photodetection diode 13. The lower p-type semiconductor layered portion 142 is normally doped and has the p-dopant in the amount not greater than half of that of the upper p-type semiconductor layered portion 141. In addition, the lower p-type semiconductor layered portion 142 has a thickness lower than that of the single-layered structure of the p-type semiconductor layered portion 14. The decrease in the thickness of the lower p-type semiconductor layered portion 142 will result in the decrease in the light absorbed by the p-type semiconductor layer 14, and thus the light entering and absorbed by the intrinsic semiconductor layer 15 is increased. Furthermore, since the lower p-type semiconductor layered portion 142 has a concentration of the p-type dopant of borane within a normal level, the uniformity of the built-in voltage of the photodetection diode 13 can be effectively prevented from being destroyed.

More specifically, the lower p-type semiconductor layered portion 142 of the p-type semiconductor layer 14 of the photodetection diode 13 of each of the pixel sensing portions 320 is formed using the CVD techniques under a first hydrogen gas ratio, a first deposition temperature, and a first deposition power. The upper p-type semiconductor layered portion 141 is formed using the CVD techniques under a second hydrogen gas ratio, a second deposition temperature, and a second deposition power. The first hydrogen gas ratio, the first deposition temperature and the first deposition power are respectively greater than the second hydrogen gas ratio, the second deposition temperature and the second deposition power, such that the lower p-type semiconductor layered portion 142 has a microcrystalline silicon structure having the crystallinity greater than 40%, and the band gap of the microcrystalline silicon structure is greater than 1.7 eV.

In one form, the multilayered structure of the p-type semiconductor layer 14 may include more than two layered portions. For example, the p-type semiconductor layer 14 may include the lower and upper p-type semiconductor layered portions 142, 141, and an intermediate p-type semiconductor layered portion (not shown) disposed between the lower and upper p-type semiconductor layered portions 142, 141. The upper p-type semiconductor layered portion 141 has the amorphous silicon structure and is heavily doped with the p-type dopant of borane, and each of the lower p-type semiconductor layered portion 142 and the intermediate p-type semiconductor layered portion has the microcrystalline structure, a concentration of the p-type dopant of borane within the normal level and a reduced thickness as mentioned above. Similarly, decrease in the thicknesses of the lower and intermediate p-type semiconductor layered portions 142 will result in the decrease in the light absorbed by the lower and intermediate p-type semiconductor layered portions 142, and thus the light entering into and absorbed by the intrinsic semiconductor layer 15 is increased. Furthermore, since each of the lower and intermediate p-type semiconductor layered portions 142 has the concentration of the p-type dopant of borane within the normal level, damage in uniformity of the built-in voltage of the photodetection diode 13 can be prevented. It is noted that when the p-type semiconductor layer 14 has more than two of the layered portions that are stacked one above another, the topmost layered portion, which is the most distant from the intrinsic semiconductor layer 15, is heavily doped with the p-type dopant of borane, and the other ones of the layered portions have the concentration of the p-type dopant of borane within the normal level.

Referring back to FIGS. 3 and 6, the n-type semiconductor layer 16 may have a single-layered structure or a multi-layered structure. The n-type semiconductor layer 16 may be made from silanes, hydrogen gas and phosphine using the CVD techniques. As shown in FIG. 6, the multi-layered structure of the n-type semiconductor layer 16 of the photodetection diode 13 of each of the pixel sensing portions 320 includes an upper n-type semiconductor layered portion 161 formed on the intrinsic semiconductor layer 15 and a lower n-type semiconductor layered portion 162 formed on the upper n-type semiconductor layered portion 161. The lower n-type semiconductor layered portion 162 has a band gap greater than 1.7 eV and an n-type dopant in an amount not less than two times of that of the upper n-type semiconductor layered portion 161. The n-type dopant may be phosphorus, which is provided from a phosphorus-containing gas which includes phosphine, thereby forming the upper n-type semiconductor layered portion 161 having a microcrystalline silicon structure with a crystallinity greater than 40%.

Specifically, in the multi-layered structure of the n-type semiconductor layer 16, the lower n-type semiconductor layered portion 162 of the n-type semiconductor layer 16 has the non-crystalline silicon structure and is heavily doped with phosphorus, and thus the dangling bonds in the lower n-type semiconductor layered portion 162 are increased. If the n-type semiconductor layer 16 only includes the lower n-type semiconductor layered portion 162, uniformity of the built-in voltage of the photodetection diode 13 tends to be further damaged or destroyed. Inclusion of the upper n-type layered portion 161 will alleviate the damage or destruction of the uniformity of the built-in voltage of the photodetection diode 13. The upper n-type semiconductor layered portion 161 is normally doped and has the n-dopant in the amount not greater than half of that of the lower n-type semiconductor layered portion 162. In addition, the upper n-type semiconductor layered portion 161 has a thickness lower than that of the single-layered structure of the n-type semiconductor layered portion 16. The decrease in the thickness of the upper n-type semiconductor layered portion 161 will result in the decrease in the light absorbed by the n-type semiconductor layer 16, and thus the light that is reflected on the n-type semiconductor layer 16 and absorbed by the intrinsic semiconductor layer 15 is increased. Hence, the photoelectric conversion efficiency of the photodetection diode 13 can be improved. Besides, the dangling bonds in the n-type semiconductor layer 16 are reduced, and thus the uniformity of the built-in voltage of the photodetection diode 13 is improved.

Specifically, the upper n-type semiconductor layered portion 161 is formed using the CVD techniques under a third hydrogen gas ratio, a third deposition temperature, and a third deposition power. The lower n-type semiconductor layered portion 162 is formed using the CVD techniques under a fourth hydrogen gas ratio, a fourth deposition temperature, and a fourth deposition power. The third hydrogen gas ratio, the third deposition temperature and the third deposition power are respectively greater than the fourth hydrogen gas ratio, the fourth deposition temperature, and the fourth deposition power. Therefore, the upper n-type semiconductor layered portion 161 has the microcrystalline silicon structure greater than 40% and the band gap of the microcrystalline silicon structure is greater than 1.7 eV.

In one form, the multilayered structure of the n-type semiconductor layer 16 may include more than two layered portions. For example, the n-type semiconductor layer 16 may include the lower and upper n-type semiconductor layered portions 162, 161, and an intermediate n-type semiconductor layered portion (not shown) disposed between the lower and upper n-type semiconductor layered portions 162, 161. The lower n-type semiconductor layered portion 162 has the amorphous silicon structure and is heavily doped with the n-type dopant of phosphorus, and each of the upper n-type semiconductor layered portion 161 and intermediate n-type semiconductor layered portion has the microcrystalline structure, a concentration of the n-type dopant of phosphorus within a normal level, and a reduced thickness as mentioned above. Similarly, the decrease in the thicknesses of the upper n-type semiconductor layered portion 161 and the intermediate n-type semiconductor layered portion will result in the decrease in the light absorbed by the upper n-type semiconductor layered portion 161 and the intermediate n-type semiconductor layered portion, and thus the light that is reflected on the n-type semiconductor layer 16 and then absorbed by the intrinsic semiconductor layer 15 is increased. In addition, since each of the upper and intermediate n-type semiconductor layered portions 161 has the concentration of the n-type dopant of phosphorus within a normal level, damage in the uniformity of the built-in voltage of the photodetection diode 13 can be prevented. It is noted that when the n-type semiconductor layer 16 includes more than two of the layered portions that are stacked one above another, the bottommost layered portion, which is the most distant from the intrinsic semiconductor layer 15, is heavily doped with the n-type dopant of phosphorus, the other ones of the layered portions disposed on the bottommost layer have the concentration of the n-type dopant of phosphorus within the normal level.

Figure 4:
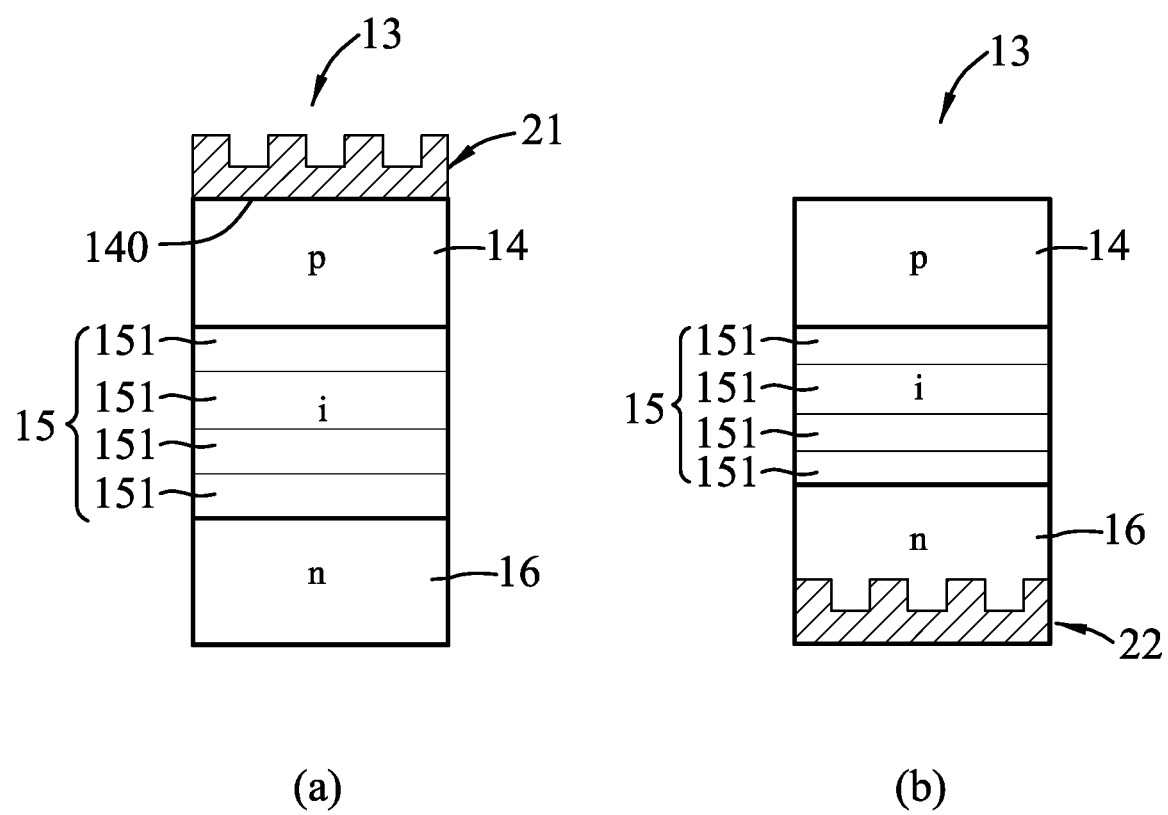
FIG. 4 illustrates two configurations (a) and (b) of incorporation of an optical film into the photodetection diode of FIG. 3.
Figure 7:
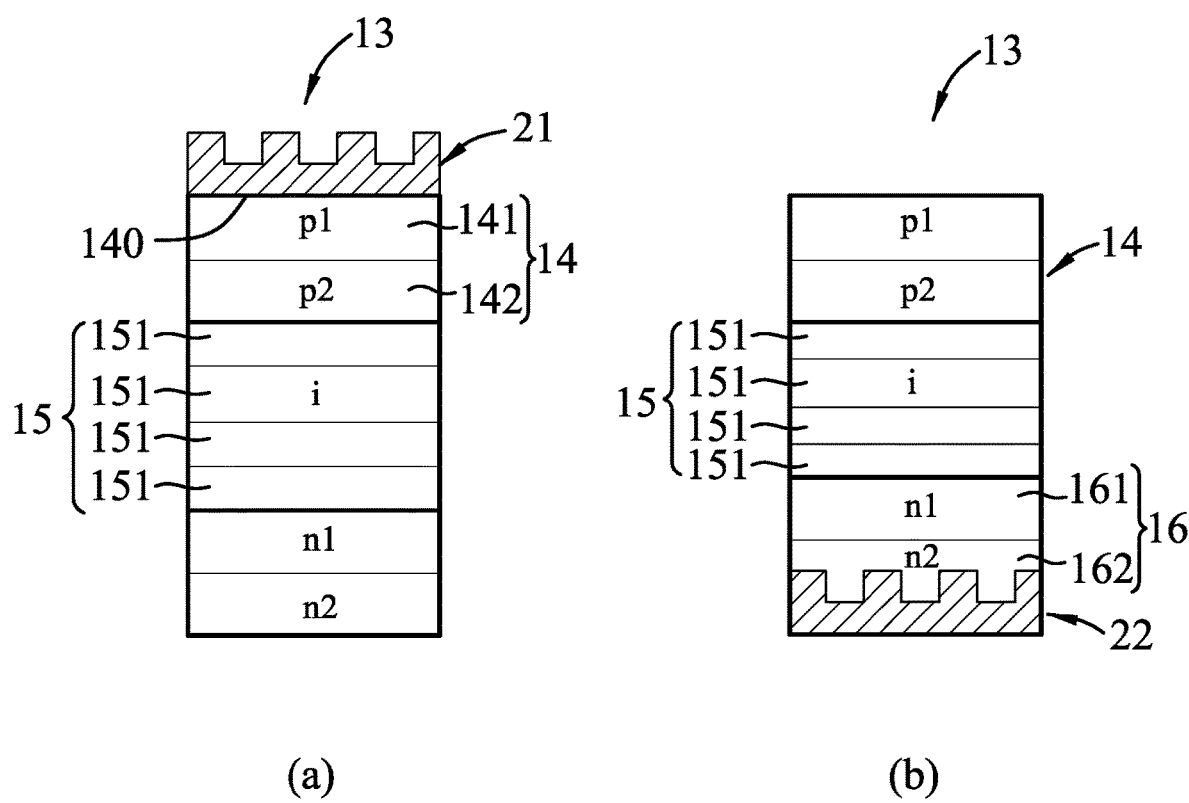
FIG. 7 is a schematic view illustrating two configurations (a) and (b) of incorporation of an optical film into the photodetection diode of FIG. 6.

Referring to the configuration (a) of FIG. 4 and the configuration (a) of FIG. 7, the photodetection diode 13 of each of the pixel sensing portions 320 may further include a first optical film 21 that is immediately disposed on the p-type semiconductor layer 14. The first optical film 21 is used for reducing a reflection rate of light from a top surface 140 of the p-type semiconductor layer 14 or a refraction angle of light in the p-type semiconductor layer 14. Since the refraction angle of light in the p-type semiconductor layer 14 is reduced, the light passing through the p-type semiconductor layer 14 is close to a normal line of the p-type semiconductor layer 14 that is perpendicular to the p-type semiconductor layer 14. Hence, a light flux passing through the p-type semiconductor layer 14 and absorbed by the intrinsic semiconductor layer 15 is increased, and the photoelectric conversion efficiency of the photodetection diode 13 is thus improved. Specifically, in the configuration (a) of FIG. 7, the first optical film 21 may be formed on a top surface of the upper p-type semiconductor layered portion 141 of the p-type semiconductor layer 14.

In one form, the first optical film 21 of the photodetection diode 13 of each of the pixel sensing portions 320 has a structure selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically. The first optical film 21 has a refractive index smaller than that of the p-type semiconductor layer 14. When the light is refracted by an interface of the intrinsic semiconductor layer 15 and the p-type semiconductor layer 14, the angle of refraction is smaller than an angle of incidence, so that the light entering into the p-type semiconductor layer 14 is close to the normal line of the p-type semiconductor layer 14 that is perpendicular to the p-type semiconductor layer 14.

Referring to the configuration (b) of FIG. 4 and the configuration (b) of FIG. 7, the photodetection diode 13 of each of the pixel sensing portions 320 may further include a second optical film 22 that is immediately disposed on the n-type semiconductor layer 16. The second optical film 22 is used for reflection of light from the n-type semiconductor layer 16 to the intrinsic semiconductor layer 15 when the light passes through the n-type semiconductor layer 16, so that the light reflected by the second optical film 22 is absorbed again by the intrinsic semiconductor layer 15. More specifically, when the light passing through the p-type semiconductor layer 14, the intrinsic semiconductor layer 15 and the n-type semiconductor layer 16 is reflected by the second optical film 22, a portion of the reflected light is absorbed by the intrinsic semiconductor layer 15 again, and the other portion of the reflected light is reflected again by the second optical film 22 and then enters into the intrinsic semiconductor layer 15. Therefore, the light can be reflected by the second optical film 22 multiple times for increasing the absorption of the intrinsic semiconductor layer 15. Specifically, in the configuration (b) of FIG. 7, the second optical film 22 is immediately disposed on a bottom surface of the lower n-type semiconductor layered portion 162 opposite to the intrinsic semiconductor layer 15.

The second optical film 22 has a structure selected from a photonic crystal structure with a refractive index varied periodically, an incident light-scattered crystal structure with a refractive index varied non-periodically, and an incident light-diffused crystal structure with a refractive index varied non-periodically. Hence, since the light passing through the n-type semiconductor layer can be reflected by the second optical film, the reflected light can be absorbed again by the intrinsic semiconductor layer, and the wavelength range of the light that is able to be absorbed by the intrinsic semiconductor layer 15 is expanded. Thus, the photoelectric current produced in the intrinsic semiconductor layer is increased.

In one form, each of the pixel sensing portions 320 may include two or more of the photodetection diodes that are electrically connected in series and superimposed on one another in the first direction (L1). Taking one of the pixel sensing portions 320 including two of the photodetection diodes 13 superimposed on one another in the first direction (L1) as an example, the n-type semiconductor layer 16 of one of the photodetection diodes 13 is proximate to the p-type semiconductor layer 14 of the other of the photodetection diodes 13. In the exemplified pixel sensing portion 320, the second optical film 22 may be disposed on the bottom surface of the n-type semiconductor layer 16 of the one of the photodetection diodes 13 so that the light passing through the n-type semiconductor layer 16 of the one of the photodetection diodes 13 can be reflected by the second optical film 22 and absorbed by the intrinsic semiconductor layer 15 of the one of the photodetection diodes 13 again. Similarly, the second optical film 22 may be disposed on the bottom surface of the other one of the photodetection diodes 13 so that the light passing through the n-type semiconductor layer 16 of the one of the photodetection diodes 13 can be reflected by the second optical film 22 and absorbed by the intrinsic semiconductor layer 16 of the other one of the photodetection diodes 13 again. Therefore, the photoelectric conversion efficiency of the pixel sensing portions 320 is improved.

Figure 5:
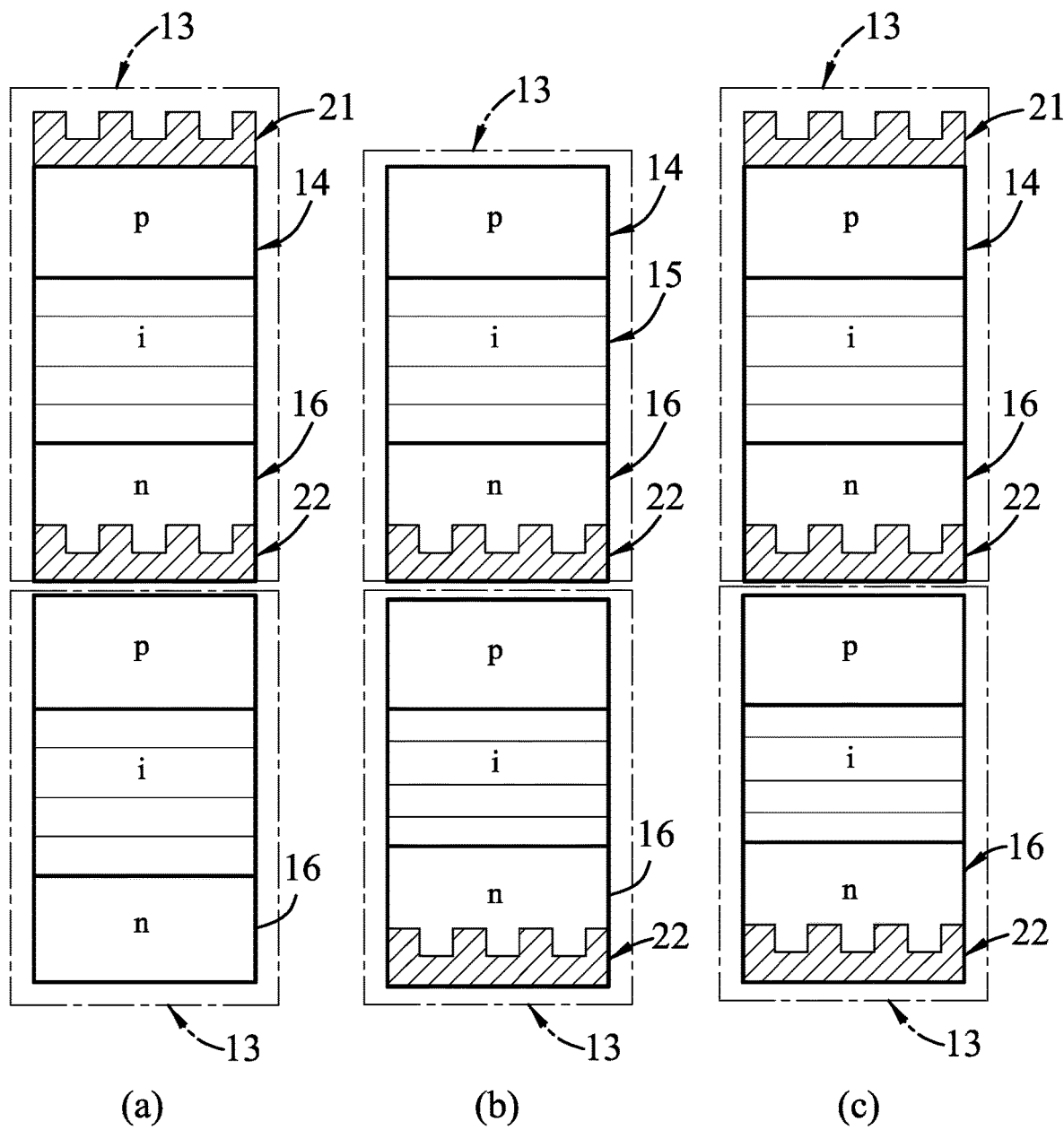
FIG. 5 is a schematic view illustrating three configurations (a) to (c) of incorporation of two or more optical films into the photodetection diode of FIG. 3.
Figure 8:
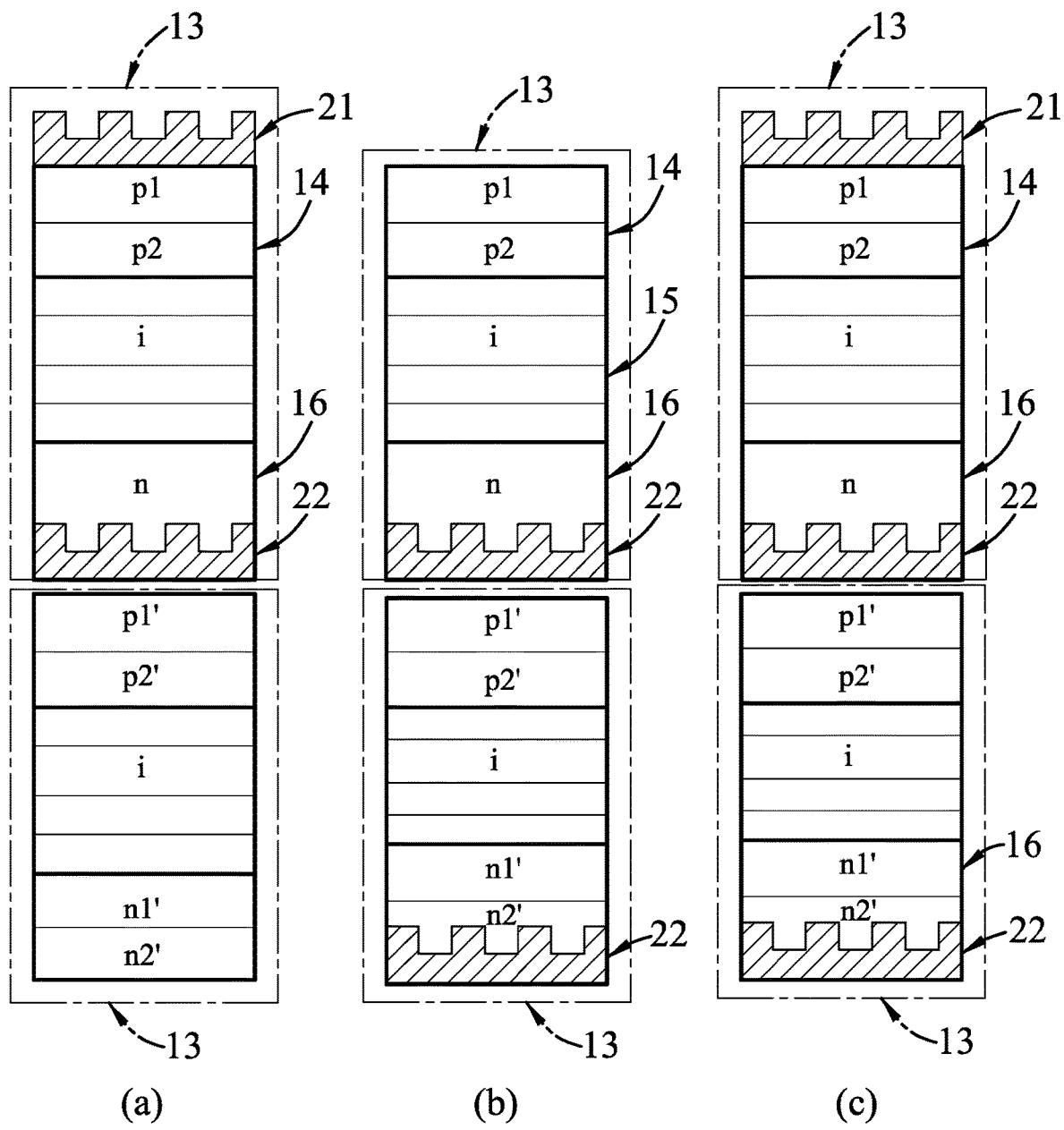
FIG. 8 is a schematic view illustrating three configurations (a) to (c) of incorporation of two or more optical films into the photodetection diode of FIG. 6.

Referring to FIGS. 5 and 8, the two or more of the photodetection diodes 13 included in one of the pixel sensing portions 320 may have the first optical film and/or the second optical film 22. The abovementioned pixel sensing portion 320 including the two photodetection diodes 13 superimposed on one another in the first direction (L1) is taken as an example, where the p-type semiconductor layers 14 of the photodetection diodes 13 have the single-layered structure or the multi-layered structure and the n-type semiconductor layers 16 of the photodetection diodes have the single-layered structure or the multi-layered structure. Referring to the configurations (a) of FIGS. 5 and 8, the one of the photodetection diodes 13 has the first optical film 21 disposed on the top surface of the p-type semiconductor layer 14 and the second optical film 22 disposed on the bottom surface of the n-type semiconductor layer 16. Referring to the configurations (b) of FIGS. 5 and 8, two of the second optical films 22 are disposed on the bottom surfaces of the n-type semiconductor layers 16 of the two photodetection diodes 13, respectively. Referring to the configurations (c) of FIGS. 5 and 8, the one of the photodetection diodes 13 has the first optical film 21 disposed on the top surface of the p-type semiconductor layer 14 and each of the photodetection diodes 13 has the second optical film 22 disposed on the bottom surface of the n-type semiconductor layer 16.

The first optical film 21 and the second optical film are separately made from an oxygen-containing compound or a nitrogen-containing compound using the CVD techniques or sputtering techniques. The oxygen-containing compound is selected from a group consisting of silicon oxide having a formula of $SiO_x$ with x being not less than 1, niobium pentaoxide ($Nb_2O_5$), zinc oxide (ZnO), indium tin oxide (ITO), and titanium dioxide ($TiO_2$). The nitrogen-containing compound has a formula of $SiN_y$, with y being not less than 1.

In another embodiment of the image sensor 32 of the disclosure, each of the pixel sensing portions 320 includes two of the photodetection diodes 13 that are electrically connected in series and vertically superimposed on one another. Each of the photodetection diodes 13 includes the p-type semiconductor layer 14, an intrinsic semiconductor layer and the n-type semiconductor layer 16. The intrinsic semiconductor layer of the one of the photodetection diodes 13 that bears a light incident surface has an amorphous silicon structure so as to receive the incident light having the wavelength range within the visible light region, and the intrinsic semiconductor layer of the other one of the photodetection diodes 13 that is disposed below the one of the photodetection diodes 13 has an microcrystalline silicon structure or a silicon-germanium structure so as to receive the light having the wavelength ranging from the visible light region to the infrared light region or near infrared light region. Therefore, application field of the image sensor 32, which may serve as a TFT image sensing array film, can be expanded.

The band gap is an important physical parameter of the semiconducting material and is determined by the band structure of the semiconducting material, which is relevant to the crystal structure and binding properties of atoms, etc. The silicon-germanium structure is made from silane, germane and hydrogen gas using the CVD techniques and has a band gap less than 1.7 eV. The silicon-germanium structure may include a non-crystalline silicon-germanium structure or a microcrystalline silicon-germanium structure. At room temperature (300K), the band gap of the germanium is 0.66 eV, and the band gap of the intrinsic semiconductor layer of the other one of the above photodetection diodes 13 is decreased when germanium is doped in saline. When the band gap of the intrinsic semiconductor layer of the other one of the above photodetection diodes is less than 1.7 eV, the intrinsic semiconductor layer of the other one of the above photodetection diodes can absorb the light having the wavelength ranging from the visible light region to the infrared light region (or near infrared light region). In this embodiment, by controlling the concentration of germane ($GeH_4$), the photodetection diode 13 of each of the pixel sensing portions 320 having one of the non-crystalline silicon-germanium structure and the microcrystalline silicon-germanium structure can absorb the light having an expanded wavelength ranging from 600 nm to 1000 nm.

Figure 9:
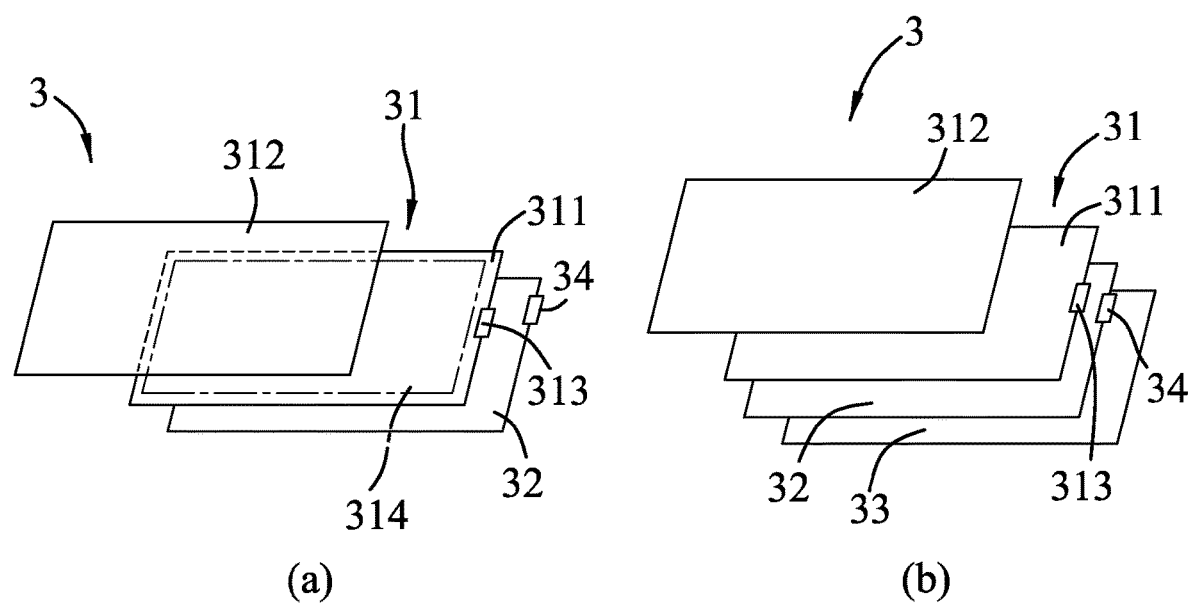
FIG. 9 is a schematic view illustrating two forms (a) and (b) of an embodiment of an image sensing-enabled display apparatus according to the disclosure.

Referring to FIG. 9, an embodiment of an image sensing-enabled display apparatus 3 according to the disclosure is illustrated. The embodiment of the image sensing-enabled display apparatus 3 includes a display unit 31 and at least one of the image sensor 32 of the disclosure. The display unit 31 includes a display member 311, a glass cover 312 disposed on the display member 311 for protecting the display member 311, and a driving integrated circuit 313 made of a flexible printed circuit (FPC). In one form, the display unit 31 may further include a touch sensor (not shown) disposed on a bottom surface of the glass cover 312 that faces the display member 311 such that the image sensing-enabled display apparatus 3 can have touch-sensing function. The display unit 31 defines an image-sensing region 314. The at least one of the image sensor 32 is disposed below the image-sensing region 314 and serves as a photodetector. As mentioned above, the image sensor 32 may include a plurality of the pixel sensing portions 320 arranged in an array. In actual use, the image sensor 32 may disposed below the display member 311 and perform image sensing within the range of the display member 311.

The image sensing-enabled display apparatus 3 may be an electronic apparatus equipped with a touch display screen, such as a portable apparatus (e.g., a cell phone, a tablet, a personal digital assistant (PDA), etc.), a personal computer, and an industrial computer. The image sensing-enabled display apparatus 3 may detect a fingerprint, a face, an eyeball or a posture of a user, etc. Taking the eyeball detection as an example, the image sensing-enabled display apparatus 3 may be incorporated with an optical imaging device (not shown) that is disposed between the display unit 31 and an eye of the user. When an eye of the user is imaged on the optical imaging device, the projection formed within an eye gaze tracking area (not shown) is defined in the display unit 31 and then is captured by a transmitting and sensing unit (not shown) disposed below the eye gaze tracking area. By virtue of the cooperation of the image sensor 32 and the display unit 31, the image sensing-enabled display apparatus 3 can serve as virtual reality (VR) equipment.

The display member 311 of the display unit 31 includes a thin film transistor for driving the display member 311 and transmitting electrical signals. The display member 311 is selected from one of an active matrix organic light emitting diode (AMOLED) image-sensing display device, a liquid crystal display (LCD) display device, a quantum dot image-sensing display device, and an electronic ink (E-ink) image-sensing display device. When the display member 311 is the LCD device, the image sensing-enabled display apparatus 3 further includes a backlight unit 33 that is disposed below the at least one image sensor 32 such that the at least one image sensor 32 is disposed between the display unit 31 and the backlight unit 33. The backlight unit 33 is used for emitting light. The backlight unit 33 may be a light emitting diode (LED) backlight module, or other electronic device that can emit light. Alternatively, when the display member 311 is the OLED device that is self-luminous, the image sensing-enabled display apparatus 3 may be free of the backlight unit 33.

In one form, the display unit 31 may define at least two of the image sensing regions 314. The image sensing-enabled display apparatus 3 includes at least two of the image sensors 32, each of which corresponds in position to a respective one of the image sensing regions 314. In the embodiment, the image sensing-enabled display apparatus 3 may further include a drive and control circuit unit 34 that is an FPC-connected integrated circuit for image reading. The drive and control circuit unit 34 is configured to turn on and turn off the image sensors 32 upon receiving turn-on and turn-off signals inputted by a user, respectively.

When the number of the image-sensing regions 314 of the display unit 31 and the number of the image sensors are respectively exemplified to be two, the image-sensing regions 314 may be respectively located at the top and the bottom of the display unit 31, or may be respectively located at left and right sides of the display unit 31. More specifically, each of the image sensors 32 is disposed beneath a respective one of the image-sensing regions 314. The image sensors 32 are turned on and turned off by the turn-on and turn-off signals inputted by the user. In one form, the image-sensing regions 314 cooperatively cover the entire area of the display member 311, so that all of the light passing through the image-sensing regions 314 of the display unit 31 can be absorbed by the image sensors 32. In one form, the image sensors 32 may cover two-thirds or three-fourths of the area of the display member 311. The image sensors 32 may be controlled in such a manner that one of the image sensors 32 is turned on and the other one of the image sensors 32 is turned off.

In one form, the number of the image-sensing regions 314 may be varied based on actual use, and the turn-on or turn-off states of the image sensors 32 may be separately controlled by the user.

In the embodiment, since the polymeric substrate 42 including polyimide is disposed to the pixel sensing portions 320, the image sensor 32 of the disclosure can be disposed below the display member 311, which is flexible, and thus the resulting image sensing-enabled display apparatus 3 can meet the market requirements of being thin and flexible.

Figure 10:
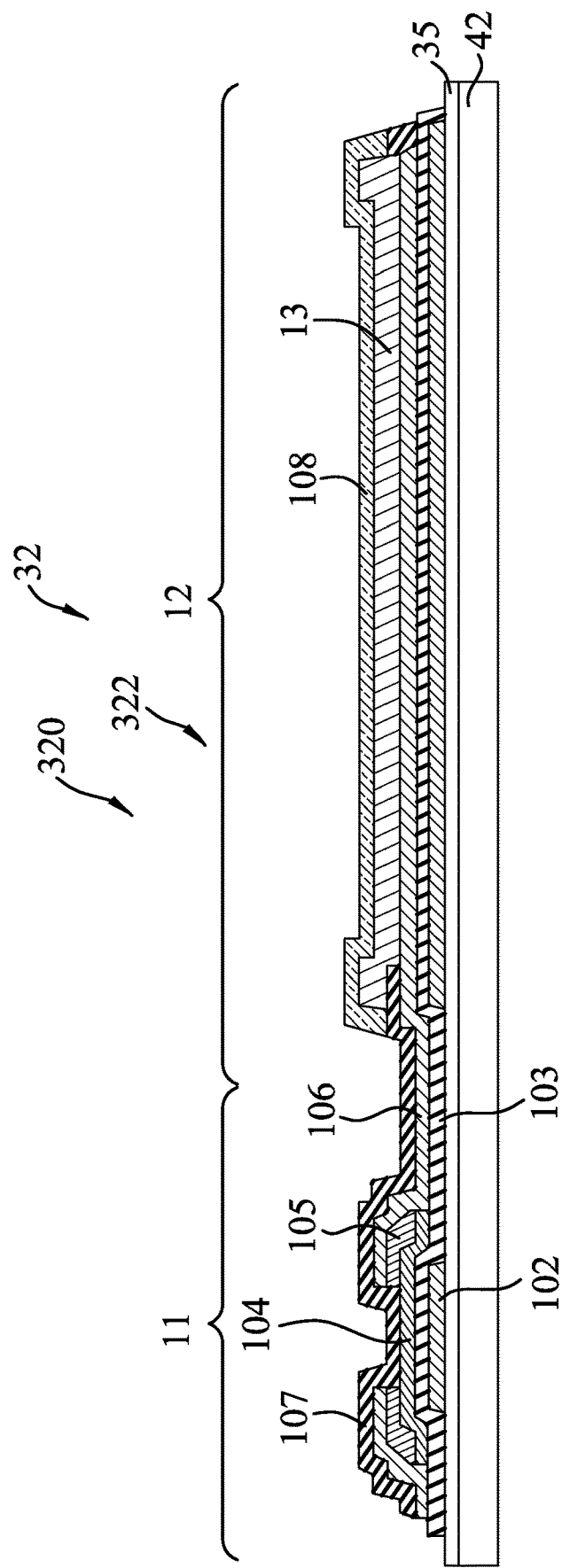
FIG. 10 is a fragmentary partly cross-sectional view illustrating incorporation of a waterproof and oxygen barrier structure into the image sensor of FIG. 2.

Referring to FIG. 10, in one form, each of the image sensors 32 includes a waterproof and oxygen barrier structure 35 that is disposed between the pixel sensing portions 320 and the polymeric substrate 42. More specifically, the waterproof and oxygen barrier structure 35 is immediately formed on the polymeric substrate 42. The waterproof and oxygen barrier structure 35 may include a plurality of inorganic layers (not shown) and a plurality of organic layers (not shown) alternately formed on one another. Each of the inorganic layers includes aluminum oxide ($Al_2O_3$), silicon oxide ($SiO_x$) with x being greater than 1, or silicon nitride ($SiO_y$) with y being greater than 1. Each of the organic layers includes an acrylic-based polymeric material or poly-p-xylylene-based polymeric material. In the waterproof and oxygen barrier structure 35, each of the inorganic layers is water resistant, and a flow of oxygen in the waterproof and oxygen barrier structure 35 is impeded by the organic layers. In addition, when the image sensing-enabled display apparatus 3 is flexible, the organic layers can serve as buffer layers. Therefore, the weak-light imaging can be realized in the image sensing-enabled display apparatus 3 including the image sensors 32 that have the waterproof and oxygen barrier structure 35 and the polymeric substrate 42 and that can be integrated with the display member 311, which is flexible.

Figure 11:
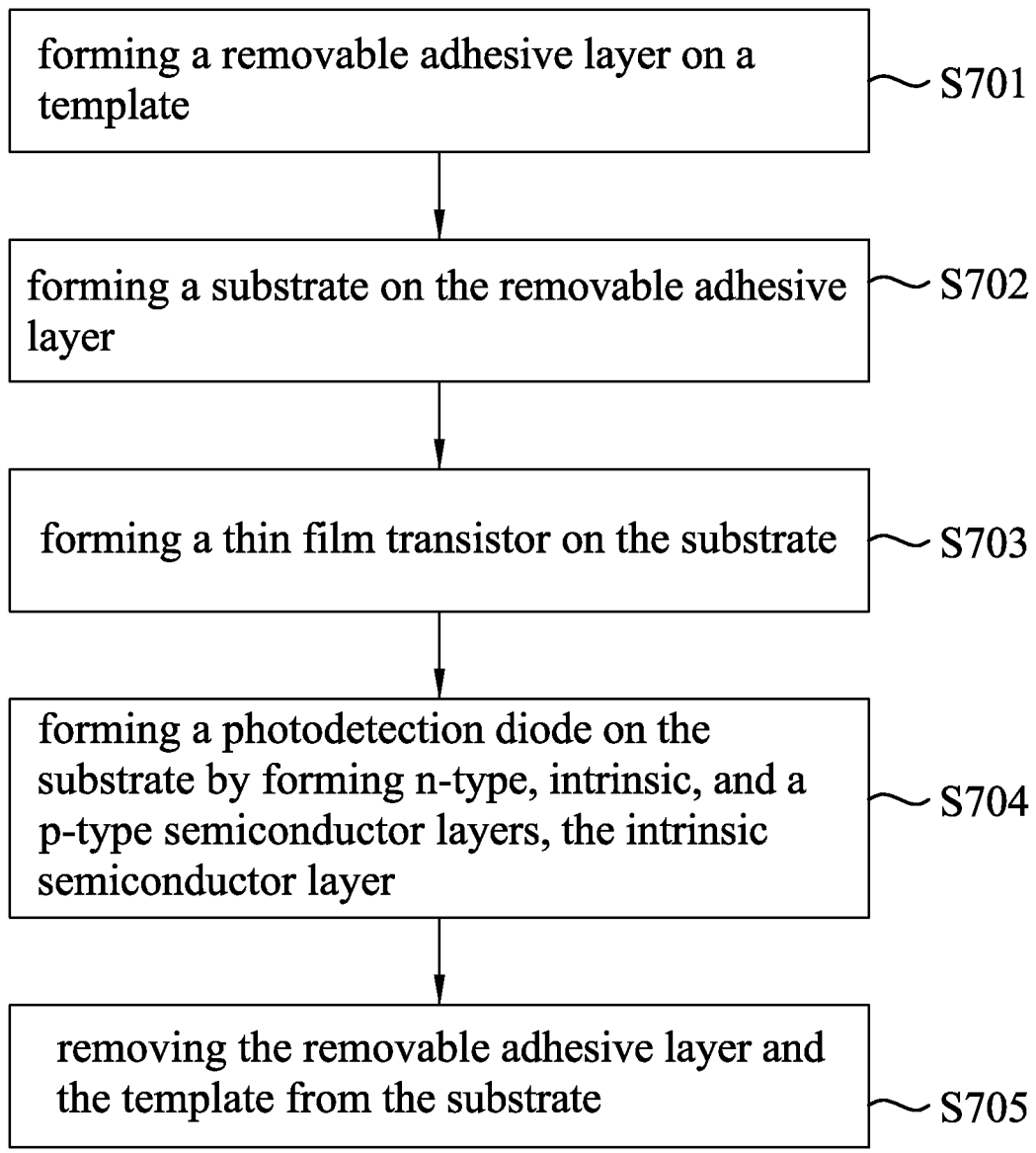
FIG. 11 is a flow chart of an embodiment of a method of making an image sensor according to the disclosure.
Figure 12:
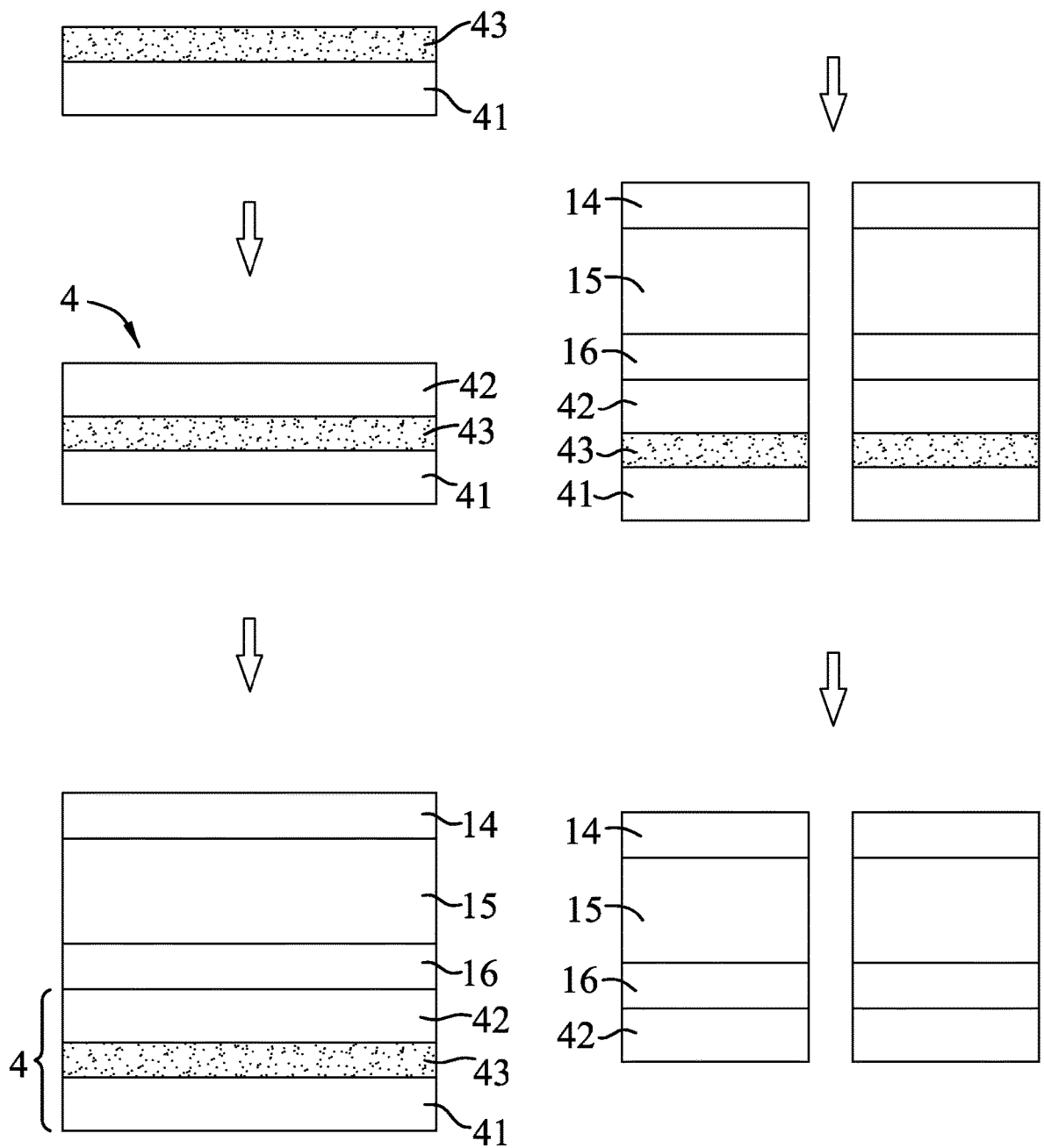
FIG. 12 is a schematic view illustrating consecutive steps of the method of making an image sensor of FIG. 11.

Referring to FIGS. 11 and 12, an embodiment of a method of making the embodiment of the image sensor 32 which has relatively high photoelectric conversion efficiency is illustrated. The method includes steps S701 to S705.

In Step S701, a removable adhesive layer 43 is formed on a template 41. In the embodiment, the template 41 is a glass plate, and the removable adhesive layer 43 is made from an adhesive solution adapted for being coated on the template 41. In one form, the template 41 may be made from other material useful for film formation thereon.

In Step S702, the substrate 42 is formed on the removable adhesive layer 43 such that the removable adhesive layer 43 is disposed between the template 41 and the substrate 42.

In Step S703, the thin film transistor 11 is formed on the substrate 42.

In step S704, the photodetection diode 13 is formed on the substrate 42 by forming the n-type semiconductor layer 16 on the substrate 42, forming the intrinsic semiconductor layer 15 on the n-type semiconductor layer 16, and forming the p-type semiconductor layer 14 on the intrinsic semiconductor layer 15.

As mentioned in the above, the p-type semiconductor layer 14 may include the multilayered structure, and formation of the photodetection diode 13 on the substrate 42 is carried out by forming the n-type semiconductor layer 16 on the substrate 42, forming the intrinsic semiconductor layer 15 on the n-type semiconductor layer 16, forming the lower p-type semiconductor layered portion 142 on the intrinsic semiconductor layer 15, and forming the upper p-type semiconductor layered portion 141 on the lower p-type semiconductor layered portion 142.

In step S705, the removable adhesive layer 43 and the template 41 are removed from the substrate 42 so as to form the image sensor 32.

In one form, when the image sensor 32 including the pixel sensing portions 320 is used for manufacturing the image sensing-enabled display apparatus 3, the image sensor 32 with the removable adhesive layer 43 and the template 41 may be cut for conforming a contour of the display member 311 prior to step S705. In one form, the image sensing-enabled display apparatus 3 may include the cut image sensors 32 that are put together to be conformed with the contour of the display member 311.

As mentioned in the above, the substrate 42 may be the polymeric substrate including polyimide. In this embodiment, the forming of the polymeric substrate 42 on the removable adhesive layer 43 including coating a polyimide solution on the removable adhesive layer 43, and baking the polyimide solution to cure the polyimide solution.

In one form, the method may further include forming the waterproof and oxygen barrier structure 35 on the substrate 42 by coating techniques prior to the forming of the photodetection diode 13. The forming of the waterproof and oxygen barrier structure 35 includes: alternately forming on the substrate 42 a plurality of the inorganic layers and a plurality of the organic layers on the substrate 42.

In addition, the method may further include forming the first and second optical films 21, 22 as mentioned previously.

To sum up, the merits of the image sensor 320 according to the disclosure are mentioned as below: (1) by the controlling of the band gap of the p-type semiconductor layer 14 of the photodetection diode 13 of each of the pixel sensing portions 320 to be greater than 1.7 eV, the wavelength range of the incident light that is able to pass through the p-type semiconductor layer 14 is expanded; (2) by the design of the crystallinity gradient that varies from the amorphous silicon structure to the microcrystalline silicon structure along the first direction (L1), the wavelength range of the light that is able to be absorbed by the intrinsic semiconductor layer 15 is expanded so that the photoelectric conversion efficiency is enhanced and the Staebler-Wronski effect is alleviated; (3) by the design and the process of forming the n-type semiconductor layer 16 of the photodetection diode 13 of each of the pixel sensing portions 320, the n-type semiconductor layer 16 has the amorphous silicon structure or the microcrystalline silicon structure, and thus the number of the dangling bonds in the n-type semiconductor layer 16 is reduced. Hence, the p-type and n-type semiconductor layers 14, 16 cooperatively maintain the uniformity of the built-in voltage of the photodetection diode 13; (5) by the design of the photodetection diode 13, the photodetection wavelength range of the photodetection diode 13 can be expanded to be from the visible light region to the infrared light region or near the infrared light region, and thus the photoelectric conversion efficiency is improved. In addition, the merits of the image sensing-enabled display apparatus 3 including the image sensor 32 are mentioned as below: (1) in actual use, since the image sensor 32 may be disposed below the display unit 31 or integrated with the active array thin film transistor layer of the display member 311, the image sensing-enabled display apparatus 3 can perform image sensing function and display function; (2) by the design of the polymeric substrate 42 including polyimide, and the inclusion of the waterproof and oxygen barrier structure 35 on the polymeric substrate 42, the image sensing-enabled display apparatus 3 is flexible and the low light imaging can be realized.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An image sensing-enabled display apparatus, comprising:
   a display unit defining an image-sensing region;
   at least one image sensor disposed below said image-sensing region; and
   a drive and control circuit unit configured to turn on and turn off said at least one image sensor upon receiving turn-on and turn-off signals inputted by a user, respectively,
   wherein said at least one image sensor includes
   a plurality of pixel sensing portions that are arranged in m columns and n rows, each of m and n being a positive integer not less than 1, each of said pixel sensing portions including
   a thin film transistor, and
   a photodetection diode that is electrically connected to said thin film transistor and that includes an n-type semiconductor layer, an intrinsic semiconductor layer formed on said n-type semiconductor layer, and a p-type semiconductor layer formed on said intrinsic semiconductor layer,
   wherein said intrinsic semiconductor layer of said photodetection diode of each of said photodetection pixel portions has a crystallinity gradient that varies from an amorphous silicon structure to a microcrystalline silicon structure along a first direction extending from said p-type semiconductor layer toward said n-type semiconductor layer,
   wherein said photodetection diode of each of said pixel sensing portions further includes a first optical film that is immediately disposed on said p-type semiconductor layer for reducing a reflection rate of light from a top surface of said p-type semiconductor layer or reducing a refraction angle of light in said p-type semiconductor layer,
   wherein said first optical film of said photodetection diode of each of said pixel sensing portions has a structure selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically, said first optical film having a refractive index smaller than that of said p-type semiconductor layer, wherein said at least one image sensor is formed on a polymeric substrate, and said image sensing-enabled display apparatus further includes a waterproof and oxygen barrier structure that is disposed between said pixel sensing portions and said polymeric substrate, and wherein said waterproof and oxygen barrier structure includes a plurality of inorganic layers and a plurality of organic layers alternately formed on one another, said waterproof and oxygen barrier structure being directly formed on said polymeric substrate.

2. The image sensing-enabled display apparatus of claim 1, wherein said display unit includes a display member selected from an active matrix organic light emitting diode (AMOLED) display device, a liquid crystal display (LCD) device, a micro light emitting diode (LED), a quantum dot display device, and an electronic ink (E-ink) display device.

3. The image sensing-enabled display apparatus of claim 2, wherein said display member is the LCD device, said image sensing-enabled display apparatus further comprising a backlight unit that is disposed below said at least one image sensor such that said at least one image sensor is disposed between said display unit and said backlight unit.

4. The image sensing-enabled display apparatus of claim 1, wherein said display unit defines at least two of said image-sensing regions, said image sensing-enabled display apparatus comprising at least two of said image sensors, each of which corresponds in position to a respective one of said image-sensing regions.

5. The image sensing-enabled display apparatus of claim 1, wherein each of said inorganic layers includes aluminium oxide ($Al_2O_3$), silicon oxide ($SiO_x$) with x being greater than 1, or silicon nitride ($SiN_y$) with y being greater than 1; and wherein each of said organic layers includes an acrylic-based polymeric material or a poly-p-xylylene-based polymeric material.

6. The image sensing-enabled display apparatus of claim 1, wherein said intrinsic semiconductor layer of said photodetection diode of each of said pixel sensing portions defines a plurality of intrinsic semiconductor sub-layers extending along a second direction perpendicular to the first direction, each of said intrinsic semiconductor sub-layers having a homogenous crystallinity.

7. The image sensing-enabled display apparatus of claim 1, wherein said polymeric substrate is disposed to permit said thin film transistor and said photodetection diode of each of said pixel sensing portions to be formed thereon, said polymeric substrate including polyimide.

8. The image sensing-enabled display apparatus of claim 1, wherein said photodetection diode of each of said pixel sensing portions further includes a second optical film that is immediately disposed on said n-type semiconductor layer for reflection of light from said n-type semiconductor layer to said intrinsic semiconductor layer when the light passes through said n-type semiconductor layer.

9. The image sensing-enabled display apparatus of claim 8, wherein said second optical film of said photodetection diode of each of said pixel sensing portions has a structure selected from a photonic crystal structure with a refractive index varied periodically, an incident light-scattered crystal structure with a refractive index varied non-periodically, and an incident light-diffused crystal structure with refractive index varied non-periodically, said second optical film having a refractive index smaller than that of said n-type semiconductor layer.

10. The image-enabled display apparatus of claim 8, wherein said first optical film and said second optical film are separately made from one of an oxygen-containing compound and a nitrogen-containing compound.

11. The image-enabled display apparatus of claim 10, wherein the oxygen-containing compound is selected from a group consisting of silicon oxide having a formula of $SiO_x$ with x being not less than 1, niobium pentaoxide ($Nb_2O_5$), zinc oxide (ZnO), indium tin oxide (ITO), and titanium dioxide ($TiO_2$); and wherein the nitrogen-containing compound has a formula of $SiN_y$ with y being not less than 1.

* * * * *